(12) United States Patent
Mukainakano

(10) Patent No.: US 6,407,534 B1
(45) Date of Patent: Jun. 18, 2002

(54) DETECTING A MICROCURRENT AND A MICROCURRENT DETECTING CIRCUIT

(75) Inventor: Hiroshi Mukainakano, Valencia, CA (US)

(73) Assignee: Quallion LLC

( * ) Notice: Subject to any disclaimer, the term of this patent is extended or adjusted under 35 U.S.C. 154(b) by 0 days.

(21) Appl. No.: 09/778,274

(22) Filed: Feb. 6, 2001

(51) Int. Cl.$^7$ .......................... C02V 7/14; G01N 27/416
(52) U.S. Cl. ...................... 320/162; 320/166; 324/426; 324/123
(58) Field of Search ................. 320/166, 162; 324/426, 76.11, 123

(56) References Cited

U.S. PATENT DOCUMENTS 4,396,986 A * 8/1983 Salesky .................... 324/76.11

FOREIGN PATENT DOCUMENTS

JP           9-312172         12/1997

* cited by examiner

Primary Examiner—Gregory Toatley
(74) Attorney, Agent, or Firm—M. Elizabeth Bush; Freilich, Hornbaker & Rosen

(57) ABSTRACT

Current flows from the secondary battery via the current mirror circuit to the regenerative capacitor. The current mirror circuit multiplies by a numerical constant the current flowing from the secondary battery and supplies the amplified current through the regenerative capacitor. When a voltage value of the regenerative capacitor reaches a predetermined maximum value, the current flows from the regenerative capacitor to the external load. The current flow from the regenerative capacitor continues until the voltage decreases to a predetermined minimum value. Immediately before the voltage of the regenerative capacitor reaches the predetermined minimum value, a terminal voltage of the secondary battery in an open state is measured. This structure enables a charging-and-discharging microcurrent from the secondary battery to be easily monitored, while simultaneously detecting a remaining capacity of the secondary battery.

24 Claims, 6 Drawing Sheets

| Period | First Switch ON/OFF State | Second Switch ON/OFF State | Secondary Battery Condition | Regenerative Capacitor Condition |
|---|---|---|---|---|
| (1) | OFF | ON | Open | Discharged |
| (2) | ON | OFF | Discharged | Charged |
| A | OFF | OFF | Monitor Battery Voltage | |

DETECTING A MICROCURRENT AND A MICROCURRENT DETECTING CIRCUIT

BACKGROUND OF THE INVENTION

1. Field of the Invention

This invention generally relates to batteries and their monitoring circuits and particularly to a secondary battery monitoring circuit capable of determining a microcurrent flowing through a secondary battery and to a method for measuring the amount of microcurrent flowing through a secondary battery.

2. Discussion of the Related Art

FIG. 1 shows a battery circuit 25, including a battery condition monitoring circuit, which measures a remaining charge state of a secondary battery. FIG. 1 illustrates the circuit of Japanese Patent Application Toku Kai Hei 9-312172 entitled "A Battery Pack, Charging Device, and Charging System and Charging Method." The FIG. 1 circuit uses a microprocessor or microcontroller to detect battery voltage and charge-and-discharge current. Based on the battery voltage and charge-and-discharge current measurements, the monitoring circuit calculates the battery's remaining capacity or remaining stored charge. The microcontroller can communicate the battery's remaining capacity to an external device, such as a portable computer. The external device then is able to display information related to the battery, such as remaining usable battery life.

A battery condition monitoring circuit includes a current monitor circuit 18 and a voltage monitor circuit 19. The battery circuit 25 measures the voltage and the charge-and-discharge current of secondary batteries 1, 1A, 1B and 1C. The battery circuit 25 predicts the battery's remaining capacity from this information and can transfer that remaining capacity information to an external device. The current monitor circuit 18 and the voltage monitor circuit 19 transfer the measured values to the microcontroller 20.

Voltage detector device 17 detects the level of the secondary battery voltage in comparison to a predetermined battery voltage. Switch circuit 3 prevents the lithium ion secondary battery from discharging below the predetermined voltage. Second switch circuit 4 stops the charging of the battery when the battery voltage reaches a predetermined voltage. Together, the voltage detector device 17 and the second switch circuit 4 prevent a lithium ion secondary battery from overcharging. Microcontroller 20 controls the charging and discharging of the secondary batteries.

SUMMARY OF THE PREFERRED EMBODIMENTS

Aspects of the present invention provide a battery circuit having a capacitor, current amplifier and a monitor. The capacitor is selectively connectable to a secondary battery. The current amplifier amplifies battery current received from the secondary battery and supplies output current to the capacitor. The monitor circuit, which is coupled to the capacitor, detects a characteristic of the secondary battery indirectly by measuring a voltage of the capacitor or by measuring a capacitor discharge current from the capacitor.

Another aspect of the invention provides a battery circuit having a secondary battery, a current amplifier, and a monitor circuit. The current amplifier amplifies current from the secondary battery and supplies output current to a capacitor, wherein a current path from the secondary battery to the capacitor is selectively connected to charge the capacitor. The monitor circuit, which is coupled to the capacitor, detects a characteristic of the secondary battery indirectly by measuring a voltage of the capacitor with the capacitor disconnected from the secondary battery.

Yet another aspect of the present invention provides a method of measuring a microcurrent flowing from a secondary battery in a battery circuit. According to this method, a first switch is turned ON to connect the secondary battery to a capacitor in common with gate terminals of first and second transistors constituting a current amplifier and a second switch is turned OFF to disconnect drain terminals of the first and second transistors. A terminal voltage of the capacitor is monitored with a capacitor voltage monitor to identify when the terminal voltage of the capacitor increases to a predetermined maximum voltage. Then, the first switch is turned OFF and the second switch is turned ON to connect the capacitor and an external load when the terminal voltage of the capacitor reaches the predetermined maximum voltage. The terminal voltage of the capacitor is monitored with the capacitor voltage monitor to identify when the terminal voltage of the capacitor decreases to a predetermined minimum voltage. Then, the first switch is turned ON and the second switch is turned OFF. The above cycle of steps is repeated.

DETAILED DESCRIPTION OF THE PREFERRED EMBODIMENTS

Figure 1:
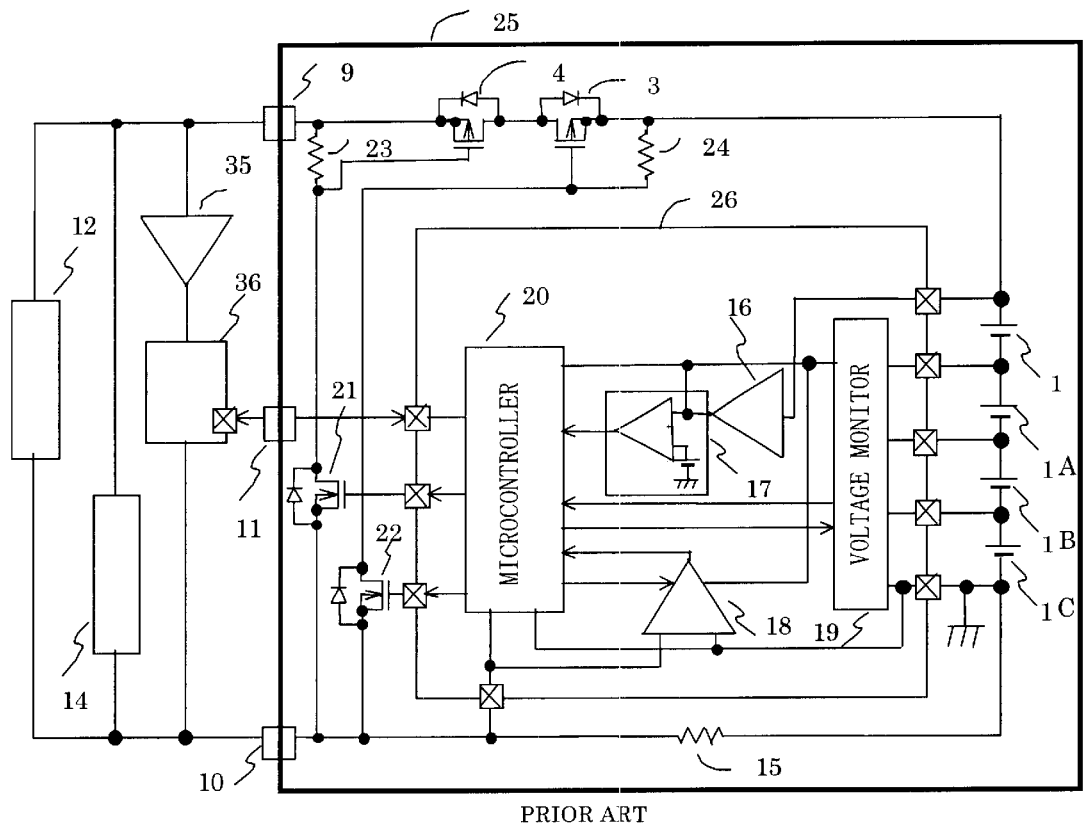
FIG. 1 illustrates a conventional battery circuit capable of detecting a microcurrent.

The FIG. 1 battery monitoring circuit measures battery voltage and discharge current by flowing a current from the battery through an external load. Detecting the battery charging state requires that an undesirably large current flow through the external load, wasting battery charge. Furthermore, the large current generates heat, which adversely affects other parts.

On the other hand, the battery charge lost during battery monitoring described above can be minimized, if the resistance of the external load is made small. In the case that the resistance of the load is kept small, however, the voltage drop across the external load is also smaller. The resulting small voltage drop across the external load makes it difficult to detect the charging and discharging battery currents.

Preferred implementations of the present invention can accurately measure a small battery discharge current, referenced here as a microcurrent, and therefore can accurately measure a battery charge. Moreover, these implementations can be inexpensive.

In particularly preferred implementations of the present invention, a microcurrent is not measured by flowing current from the battery through a load and determining a current based on a voltage drop across the load. Rather, particularly preferred implementations measure the microcurrent of the battery by first supplying the current from the secondary battery through a current mirror circuit, amplifying the current. The current mirror circuit output charges a regenerative capacitor. Preferred implementations disconnect the secondary battery from the regenerative capacitor and then determine the current flowing from the battery indirectly by measuring the voltage of the regenerative capacitor charged by the regenerative capacitor.

According to one aspect of the invention, a preferred battery circuit capable of detecting a microcurrent comprises a regenerative capacitor and a current mirror circuit. Current flows from the secondary battery through the current mirror circuit, which amplifies the current from the secondary battery into the regenerative capacitor. Preferably, two or more switches control the charge transfer from the secondary battery to the regenerative capacitor. A control circuit controls these switches.

Current flows from the battery to the regenerative capacitor via the first switch, and from the regenerative capacitor to the load via the second switch. A voltage monitor circuit measures changes in the voltage across the secondary battery and another voltage monitor measures changes in the voltage across the storage capacitor. At a predetermined timing, the control circuit directs a voltage monitor circuit to measure a terminal voltage of the regenerative capacitor. The first switch is opened when the voltage monitoring circuit measures the voltage. Particularly preferred embodiments are described below in more detail with reference to figures.

Figure 2:
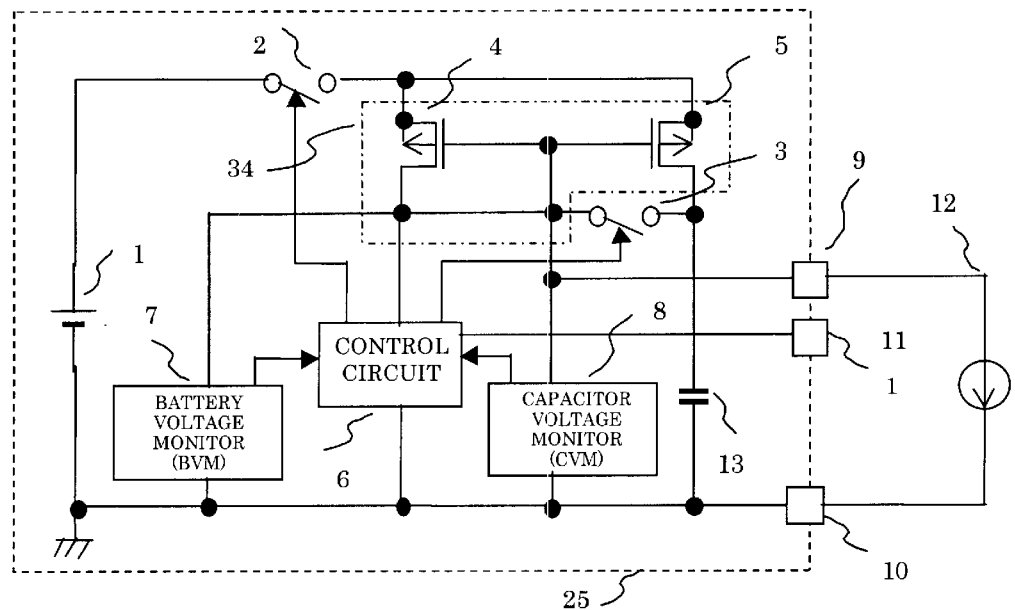
FIG. 2 illustrates a battery circuit capable of detecting a microcurrent in accordance with aspects of the present invention.

FIG. 2 illustrates a preferred embodiment of a battery circuit for detecting a remaining capacity of a secondary battery. The battery circuit is connected to at least one secondary battery 1, which is a lithium ion battery cell in this illustration. Although only one secondary battery 1 is illustrated, the circuit measures battery voltage and remaining capacity in the same manner if several secondary batteries 1 are connected in series or in parallel.

The positive terminal of the secondary battery 1 is connected to a terminal of a first switch 2. The first switch 2 preferably has a small resistance in its ON or conducting state, and in general, a field effect transistor (FET) is used for this switch. The other terminal of the first switch 2 is connected to a source of a first transistor 4 and a second transistor 5. Both the first transistor 4 and second transistor 5 are illustrated as PMOS transistors, although NMOS transistors might be used by changing the connections to the transistors.

The drain and the gate of the first transistor 4 are connected to facilitate operating the first transistor in saturation. In addition, the drain and the gate of the first transistor 4 have the same potential as the gate of the second transistor 5. As a result, the first transistor is always in a saturation region. This connection constructs a current mirror circuit 34. If the lengths and widths of the transistors forming the current mirror circuit are the same, then the amount of current flowing through the first transistor 4 and the drain terminal of the second transistor 5 are the same. If the lengths and widths of the mirror circuit transistors are adjusted appropriately, then the circuit acts as a current amplifier.

Only a small amount of current flows in a saturated transistor like that provided by selecting appropriate connections and operating voltages for the drain and the gate of the first transistor 4. Because the gate of the second transistor 5 and the gate of the first transistor 4 are connected, the potential on the gates of the two transistors is the same. The source of the first transistor 4 and the source of the second transistor 5 are also connected. Accordingly, the difference in the voltages of the gate and source of the second transistor 5 is the same potential as those of the first transistor 4. If the first transistor 4 and the second transistor 5 have the same characteristics, the amount of current flowing from both drains is the same. By using this, it becomes possible to change the current flowing through the drain of the second transistor 5.

Suppose the length of the first transistor 4 is L1 and the width of the first transistor is W1. The current flowing through the drain Id1 can be expressed as:

$$Id1 = \frac{W1}{L1} \cdot K \cdot (Vgs - Vt)^2 \qquad \text{Equation (1)}$$

Where:
K: a constant determined by a manufacturing process; and
Vt: a threshold voltage of the transistor.

Similarly, suppose the length of the second transistor 5 is L2 and the width of the second transistor is W2. The current flowing through the drain Id2 can be expressed as:

$$Id2 = \frac{W2}{L2} \cdot K \cdot (Vgs - Vt)^2 \qquad \text{Equation (2)}$$

From Equations (1) and (2), Id2/Id1 can be expressed in the following equation:

$$\frac{Id2}{Id1} = \frac{\frac{W2}{L2} \cdot K \cdot (Vgs - Vt)^2}{\frac{W1}{L1} \cdot K \cdot (Vgs - Vt)^2} = \frac{\frac{W2}{L2}}{\frac{W1}{L1}} \qquad \text{Equation (3)}$$

If L1 and L2 are equal, then Id2/Id1 equals W2/W1. Accordingly, varying W2 adjusts Id2. In other words, the current mirror circuit amplifies by a multiplication factor the current flowing through the second transistor 5 in comparison to the current flowing through the first transistor 4.

The drain terminal of the first transistor 4 is connected to a positive terminal 9 of the battery circuit 25 in the embodiment illustrated in FIG. 2. Current flows through the positive terminal 9 out to an external load 12 outside the battery circuit 25. The negative terminal of the secondary battery 1 is connected to a negative terminal 10 of the battery circuit 25. The positive terminal 9 and the negative terminal 10 are connected to one another through the external load 12.

When current Id1 flows through the load 12, the second transistor 5 of the current mirror circuit generates a drain current, the amount of which can be expressed as W2/W1× Id1. When the second switch 3 between the regenerative capacitor 13 and the load 12 is OFF, current flows from the second transistor to charge the regenerative capacitor 13 but does not reach the load 12. The first switch 3 preferably has a small resistance in its ON or conducting state, and in general, a field effect transistor (FET) is used.

The secondary battery 1 and the current mirror circuit 34 are connected via the first switch 2. When the first switch 2 is ON, the current flows from the secondary battery 1 to the current mirror circuit 34. When the first switch 2 is OFF, the secondary battery 1 is disconnected from the rest of the circuit but current can flow from the regenerative capacitor 13 to the load 12. Second switch 3 connects and disconnects the regenerative capacitor 13 and the load 12 in response to control signals from control circuit 6. When the second switch 3 is ON, current flows from the regenerative capacitor 13 to the load 12. When the second switch 3 is OFF, current flows from the current mirror circuit 34 to regenerative capacitor 13.

In the embodiment shown in FIG. 2, a battery voltage monitor circuit 7 monitors the voltage of the secondary battery 1 and a regenerative capacitor voltage monitor 8 monitors the voltage of the regenerative capacitor 13. They consume current from the secondary battery 1 when the first switch 2 is ON.

The voltage data generated from the battery voltage monitor circuit 7 and the regenerative capacitor voltage monitor 8 is sent to a control circuit 6. The control circuit 6 converts the voltage of the secondary battery 1 and the regenerative capacitor 13 to digital data using conventional analog-to-digital conversion (ADC). A description of an ADC circuit is omitted here since it is generally known in the art. High resolution analog to digital conversion is desired for accurately detecting the voltage. The control circuit 6 controls ON/OFF of switching of the first switch 2 and the second switch 3. The control circuit 6 also determines the timing of the charge transfer from the secondary battery 1 to the current mirror circuit 34 and of the timing the charge transfer from the regenerative capacitor 13 to the load 12.

The control circuit 6 can communicate a state of the battery circuit 25 to an external device. The control circuit 6 can send out from a data transfer terminal 11 the voltage data of the secondary battery 1, the voltage data of the regenerative capacitor 13, and the battery remaining capacity data. The control circuit might, for example, calculate the battery remaining capacity based on the voltage data of the secondary battery 1 and the regenerative capacitor 13. When the battery circuit in accordance with the present invention is used in a portable device, such as a notebook or other portable computer, it is possible to display how much time remains before the charge runs out based on the data gained from the data transfer terminal 11.

Figures 5, 6:
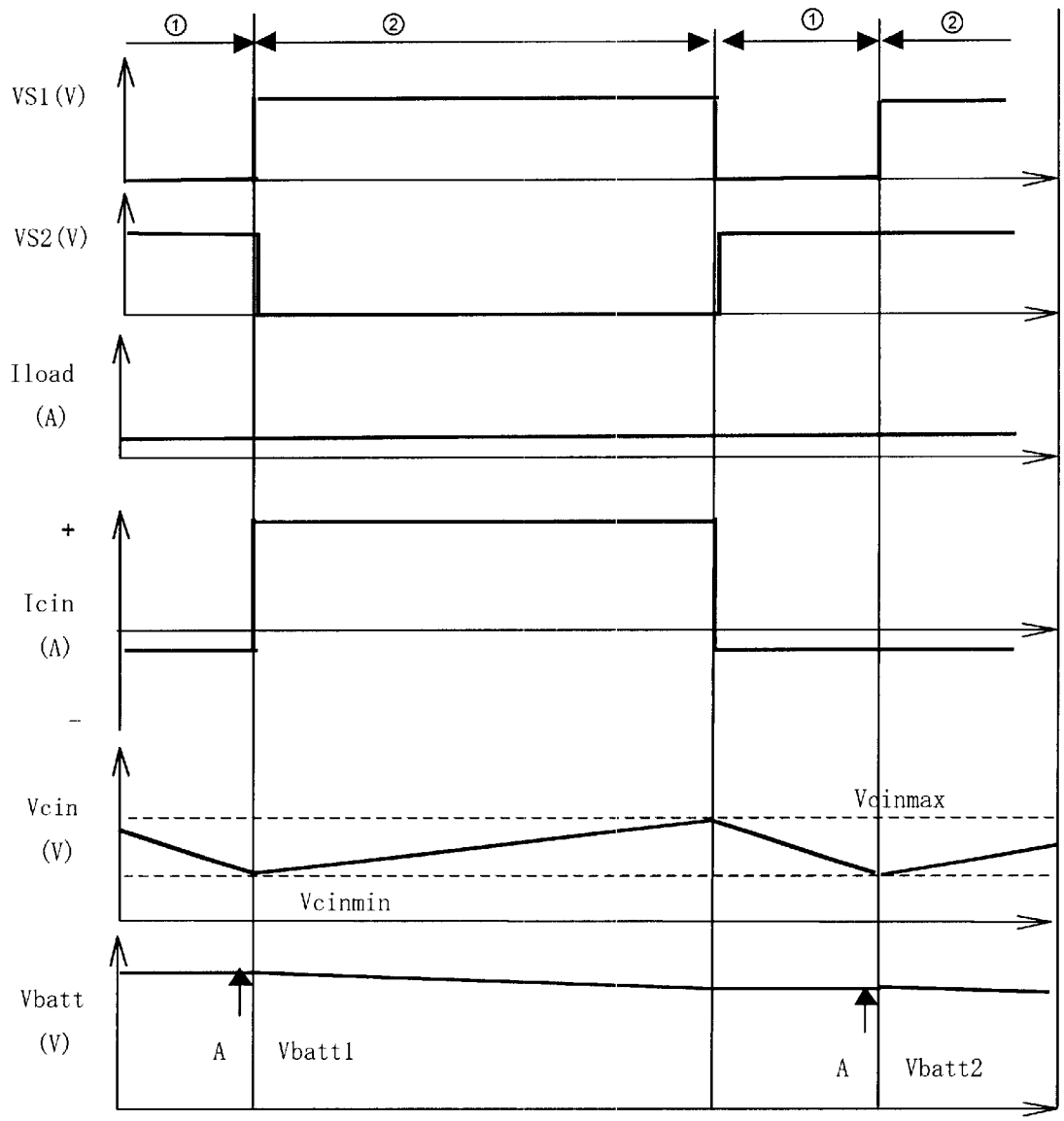
FIG. 5 shows a timing chart that explains operations of the battery circuit illustrated in FIG. 2.
FIG. 6 illustrates a table that explains modes and operations of the battery circuit illustrated in FIG. 2.

Operational modes of the illustrated battery circuit are explained with reference to FIG. 5. In FIG. 5, the x-axis represents time and the y-axis represents electric voltage or current. Control voltages of the first switch 2 and the second switch 3 are represented by VS1 and VS2, respectively. When the control voltages VS1 and VS2 are high, the switches are conducting (ON), whereas when the control voltages are low, the switches are nonconducting (OFF). Iload represents an amount of current consumed by the load 12. Here, the load current Iload is presumed to be a constant, low current. Icin and Vcin represent the current that flows into the regenerative capacitor 13 and the terminal voltage of the regenerative capacitor 13, respectively. When the first switch 2 is ON, the current flows from the drain of the second transistor 5 into the regenerative capacitor 13. This direction of flow is set to be a positive Icin direction. The voltage of the regenerative capacitor 13, Vcin, increases as more current flows. When the second switch 3 is ON, the current flows from the regenerative capacitor 13 to the load 12. This direction of flow is set to be a negative Icin direction. At this point, the voltage of the regenerative capacitor 13, Vcin, decreases because the current is flowing out of it. A terminal voltage of the second battery 1, which is represented as Vbatt in FIG. 5, decreases as the current flows from the battery 1 to the regenerative capacitor 13.

FIG. 6 is a table that further illustrates operation of the illustrated embodiment. The table contains information relating to the ON/OFF states of the first switch 2 and the second switch 3, and the charge-and-discharge condition of the secondary battery 1 and the regenerative capacitor 13 in different periods. FIG. 5 indicates the different periods of the FIG. 6 table by an arrow and a numeral. As will be explained below, FIG. 5 also illustrates a timing at which the voltages of the secondary battery 1 and the regenerative capacitor 13 are measured.

Figure 3:
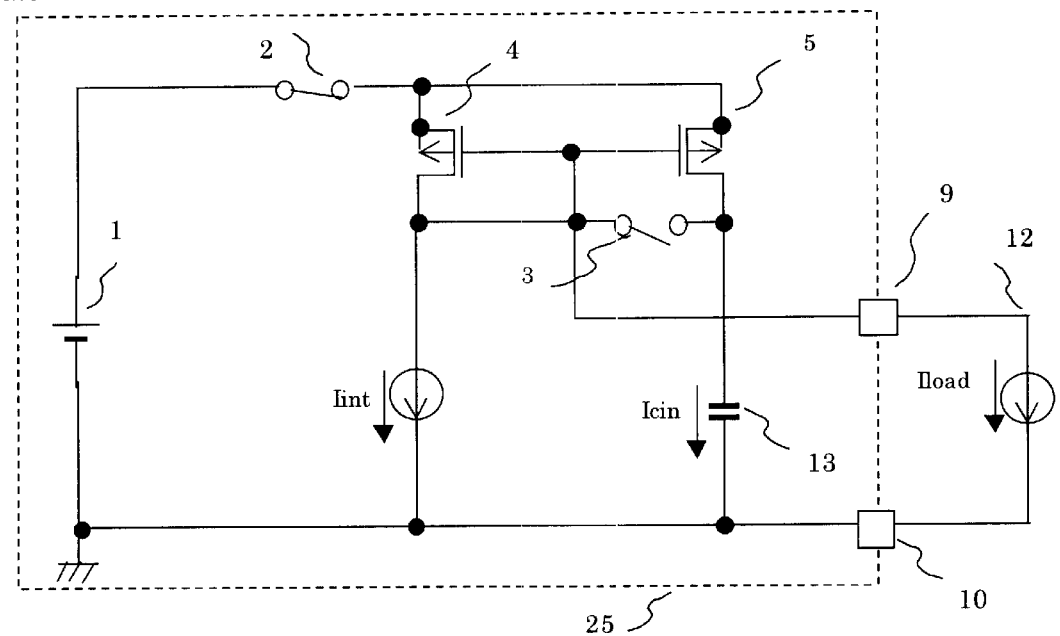
FIG. 3 illustrates an equivalent circuit that transfers a current from the secondary battery to the regenerative capacitor in the battery circuit capable of detecting a microcurrent in accordance with aspects of the present invention.
Figure 4:
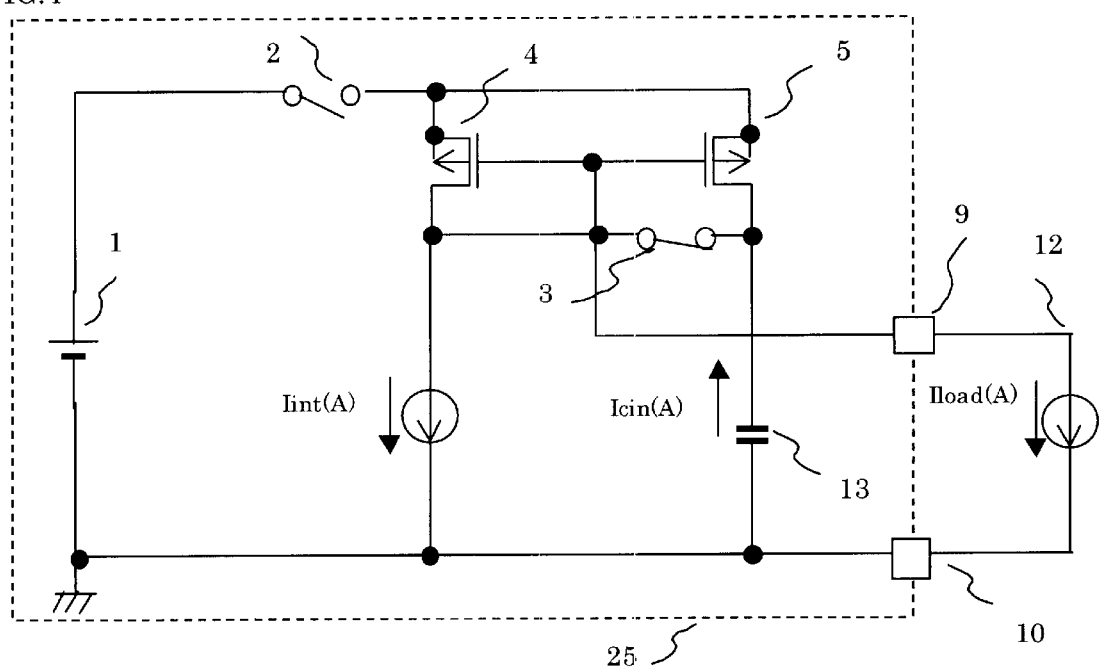
FIG. 4 illustrates an equivalent circuit that transfers a current from the regenerative capacitor to the load in the battery circuit capable of detecting a microcurrent in accordance with aspects of the present invention.

The operation and the remaining capacity detector according to the present invention are explained in reference to FIGS. 2–6. The circuit illustrated in FIG. 3 is an equivalent circuit of the circuit illustrated in FIG. 2. First, the period (2) shown in FIG. 5 is explained. During this period, the first switch 2 is ON, and the second switch 3 is OFF; thus, the secondary battery 1 and the regenerative capacitor 13 are connected. A current flows from the secondary battery 1 to the control circuit 6, the battery voltage monitor circuit 7, the regenerative capacitor monitor circuit 8 and the load 12. This current, represented as Iint in FIGS. 3 and 4, is the current flowing from the second battery 1 through the first transistor 4. The secondary battery 1 is also connected to the second transistor 5 that constitutes the current mirror circuit 34. The current that flows through the second transistor 5, Icin, can be expressed as follows:

$$Icin = \frac{W2}{W1} \times Iint. \quad \text{Equation (4)}$$

Where:
W1: the width of the gate of the first transistor 4;
W2: the width of the gate of the second transistor 5; and
Iint: The drain current of the first transistor 4.

In the above equation, the gate lengths and processing constant of the first and second transistors are presumed to be the same.

The current flowing through the secondary battery 1 can be expressed as follows:

$$Iint + Icin = \left(\frac{W2}{W1} + 1\right) \times Iint. \quad \text{Equation (5)}$$

From Equation (5), the terminal voltage Vcin of the regenerative capacitor 13 can be expressed as follows:

$$Vcin = \frac{(Iint + Icin)}{Ccin} \times t. \quad \text{Equation (6)}$$

Up to this point, it is presumed that the current flowing through the current mirror circuit 34, i.e., the current flowing through the second transistor 5, is amplified by a constant multiple of the drain current through the first transistor 4. For this presumption to be true, the second MOS transistor 5 preferably is held in a saturated condition, as follows:

$$Vd2 = Vgs2 - Vt \qquad \text{Equation}(7).$$

Where:

Vd2: The drain voltage of the second transistor 5;

Vgs2: The gate voltage of the second transistor 5; and

Vt: The threshold voltage of the first and second transistors.

As can be seen from Equation (7), when the drain voltage Vd2 of the second transistor S increases and reaches a value that equals the terminal voltage of the secondary battery 1 minus the threshold voltage Vt of the transistors, the transistor steps into an non-saturated region. If that happens, the condition expressed in Equation (2) is no longer met. Accordingly, the charging of the regenerative capacitor 13 is preferably held in the following condition:

$$V cinmax < Vbatt1 - Vt \qquad \text{Equation}(8).$$

Where:

Vcinmax: the voltage of the regenerative capacitor 13 after a full-charging by the secondary battery 1; and Vbatt: The terminal voltage of the secondary battery 1 prior to the discharge to the regenerative capacitor 13.

To ensure that the above condition is met, the regenerative capacitor voltage monitor 8 monitors the terminal voltage of the regenerative capacitor 13. When Vd2 reaches the value in Equation (5), the control circuit 6 turns the first switch 2 OFF and prevents the regenerative capacitor 13 from charging the second transistor 5.

At timing A still during the period (2), while no current is flowing out of the secondary battery 1, the battery voltage monitor circuit 7 measures the terminal voltage of e secondary battery 1. Accordingly, even if the battery has an internal impedance Rbatt, open circuit voltage of the secondary battery can be accurately measured.

$$Vbatt = Vbattopen - Idis \times Rbatt \qquad \text{Equation}(9).$$

Where:

Idis: the discharging current from the secondary battery 1; and

Vbatt: the output voltage of the secondary battery 1.

Suppose, for example, Idis equals 30 $\mu$A and Rbatt equals 30 m$\Omega$. Then, an error with respect to the open circuit voltage becomes 90 nV, which is not problematic. Accordingly, by measuring the secondary battery voltage at the timing A shown in FIG. 5, the accuracy of the measurement desirably improves. In comparison, suppose that Idis equals 3A, which is common for applications including notebook computer. Then, the error with respect to the open circuit voltage becomes 90 mV. When charged higher than a predetermined overcharging limit voltage by 90 mV, a lithium ion secondary battery is damaged and its battery capacity drops unacceptably. The method described addresses this problem because the voltage is measured accurately. In FIG. 5, the terminal voltage of the secondary battery 1 measured at the timing A is called Vbatt1.

During the period (1) indicated in FIG. 5, the first switch 2 is OFF, and the second switch 3 is ON. The secondary battery 1 is in its OPEN state and is not discharging. The circuit shown in FIG. 4 is an equivalent circuit to the circuit shown in FIG. 2 during this period. Since the second switch 3 is ON during this period, the current flows from the regenerative capacitor 13 to the load 12, the regenerative capacitor voltage monitor 9 and such. As the discharge continues, the voltage of the regenerative capacitor 13 decreases. In other words, the voltage of the regenerative capacity 13 is at its maximum when the period (1) begins and at its minimum when the period (1) ends. The voltage at which the charging of the regenerative capacitor 13 from the secondary battery 1 discontinues is expressed as Vcinmax. The voltage at which the discharging of the regenerative capacitor 13 discontinues is referred to as Vcinmin. In other words, the voltage of the regenerative capacitor 13 at the beginning of period (1) and at the end of period (1) will be referred to as Vcinmax and Vcinmin, respectively.

The regenerative capacitor voltage monitor 9 monitors the terminal voltage of the regenerative capacitor 13, and the discharging from the regenerative capacitor 13 is discontinued once the voltage of the regenerative capacitor 13 reaches a predetermined value. This predetermined value must be set in accordance with a lithium ion battery's set voltage at which the discharge must be discontinued. Even if this predetermined value is set at a voltage lower than a lithium ion battery's discharge-discontinuing voltage, this does not present a problem. What is important here is that the discharge from the regenerative capacitor 13 is discontinued at a certain voltage, Vcinmin.

The decrease of the terminal voltage of the regenerative capacitor 13 from Vcinmax to Vcinmin can be expressed as following:

$$V cinmin = Vcinmax - \frac{Iin \times T1}{Ccin}. \qquad \text{Equation (10)}$$

Where:

Ccin: the capacitance of the regenerative capacitor 13; and

T1: the length of time during which the regenerative capacitor 13 discharges to the load 12.

Thereafter, the first switch 2 turns OFF and the second switch 3 turns ON, and the operation is repeated from the period (2). Note that the discharge from the secondary battery 1 only occurs during period (2). Moreover, the current stored in the regenerative capacitor 13 during period (2) is proportional to the current flowing through the load 12. Consequently, if the current stored in the regenerative capacitor 13 can be measured, the current discharged by the secondary battery 1 can be calculated.

Below is an explanation, in reference to FIGS. 3 and 4, of how a current discharged from the secondary battery 1 is measured. FIG. 3 shows an equivalent circuit for the FIG. 2 circuit during a period in which the secondary battery 1 supplies a current to the regenerative capacitor 13. The current Iint is presumed to flow through an external load 12.

The relationship between the terminal voltage and the current of the regenerative capacitor 13 is expressed as follows:

$$Ccin \times (Vinmax \times Vcinmin) = Icin \times T1 = Iint \times \frac{W2}{W1} \times T1. \qquad \text{Equation (11)}$$

Since the current determined in the Equation (11) is flowing into the regenerative capacitor 13, the total amount of the current flowing from the battery 1 over the time period T1 can be expressed as follows:

$$(Iint + Icin) \times T1 = \left[ Iint + \left( Iint \times \frac{W2}{W1} \right) \right] \times T1. \quad \text{Equation (12)}$$

Since Vcinmax and Vcinmin are measured by the regenerative capacitor voltage monitor circuit 9, if the capacitance Ccin is predetermined at a desired value, the total amount of the current flowing from the battery 1 over the time period T1 is easily calculated from Equation (12) above. What is noteworthy here is that, because Equation (12) is independent of any resistance, the total amount of the current flowing from the battery 1 over the time period T1 can be determined without accounting for the internal impedance. Accordingly, selecting parts to be used in the battery circuit 25 becomes easier. Nevertheless, the switch is most preferably selected to have a low ON resistance since, if the ON resistance is high, the terminal voltage of the regenerative capacitor 13 is not increased to a desired extent.

In Equation (6), the left-hand side of the equation is (i×t); thus the unit is (A×hr). The capacitor of the battery is normally represented in (A×hr) as well. Therefore, the remaining capacity of the secondary battery can be calculated easily by subtracting the value of Equation (10) from the remaining capacity at the charge-completion time, each time the battery discharges to the regenerative capacitor 13.

FIG. 4 shows an equivalent circuit for the FIG. 2 circuit during period (1). During period (1), the secondary battery 1 is in an open condition, and the regenerative capacitor 13, rather than the secondary battery 1, discharges to the external load 12. Since the voltage of the secondary battery 1 can be measured in such a condition, the measurement becomes desirably accurate. The discharge continues until the voltage of the regenerative capacitor reaches Vcinmin.

Figure 7:
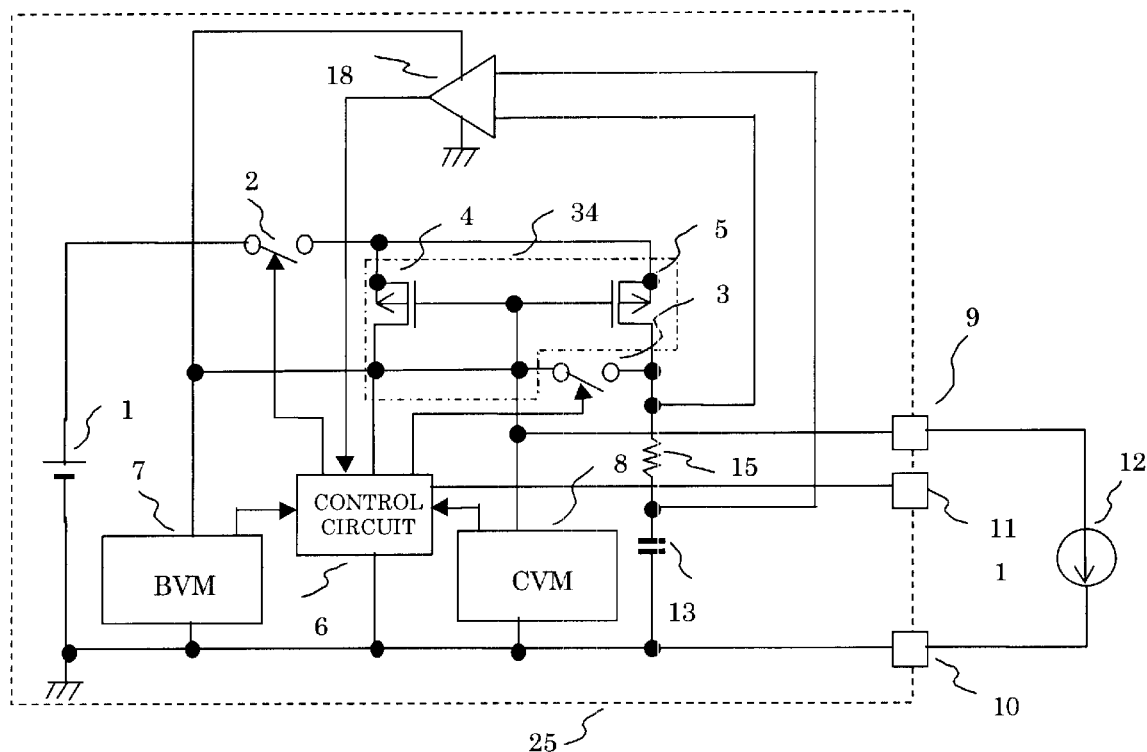
FIG. 7 illustrates a battery circuit capable of detecting a microcurrent in accordance with other aspects of the present invention.

FIG. 7 shows another embodiment of the present invention. A sense resistor 15 is placed between the regenerative capacitor 13 and the second transistor 5. A current detecting device 18 amplifies a voltage drop across the sense resistor 15 and the amplified signal is sent to the control circuit 6. As a result, the current discharged from the secondary battery 1 is larger and is more easily detectable.

The embodiment effectively achieves detecting a current of a very small amount. A high detection efficiency of a current of a larger amount can nonetheless be obtained by combining a conventional detection device and the embodiment, which compensate one another. In this case, capacitance of the regenerative capacitor 13 must be increased.

Figure 8:
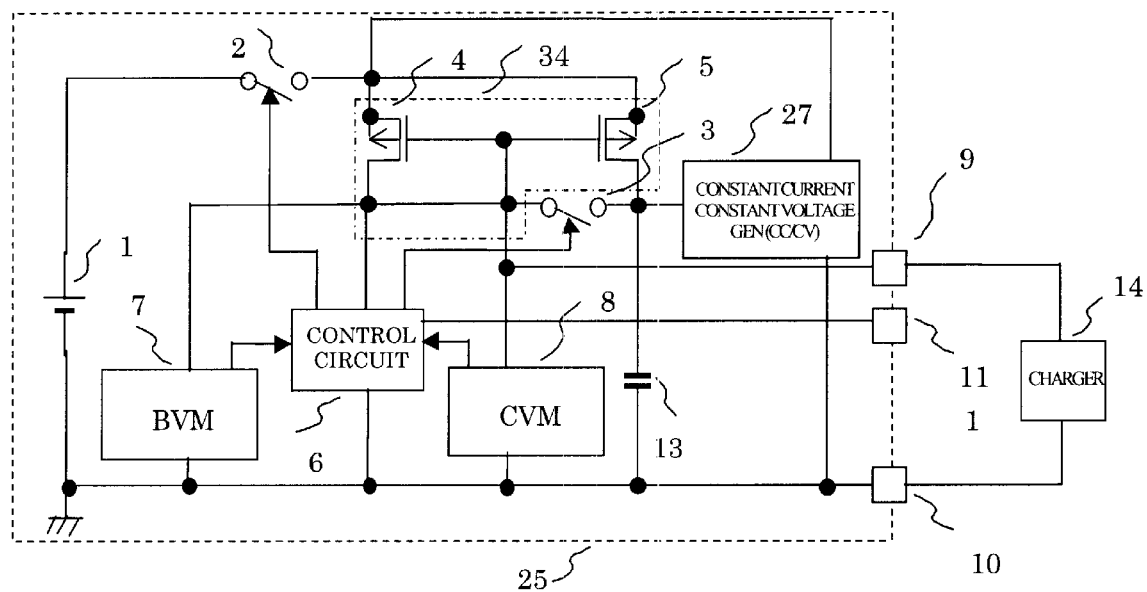
FIG. 8 illustrates a battery circuit capable of detecting a microcurrent in accordance with other aspects of the present invention.

FIG. 8 shows yet another embodiment of the present invention. Since it is generally preferred to charge a lithium ion battery using a constant current, constant voltage method, the charging current is preferably adjusted with such a circuit. In FIG. 8, the constant-current constant-voltage generation circuit 27 is placed in between the secondary battery 1 and the regenerative capacitor 13 to perform a charging function. After a charger 14 and the regenerative capacitor 13 are connected, a current flows from the regenerative capacitor 13 to the constant current, constant voltage generation circuit 27. This means that the direction of current flow is reversed compared to the flow direction shown in FIG. 2. Accordingly, by adding the circuit shown in FIG. 8, it becomes possible to obtain accurate charging current information during battery charging.

Another advantage of adding the constant-current, constant-voltage generation circuit 27 is that a battery can be charged safely with a constant-voltage charging device. Since there are many known methods of creating a constant-current, constant-voltage generation circuit, further explanation is omitted here.

Figure 9:
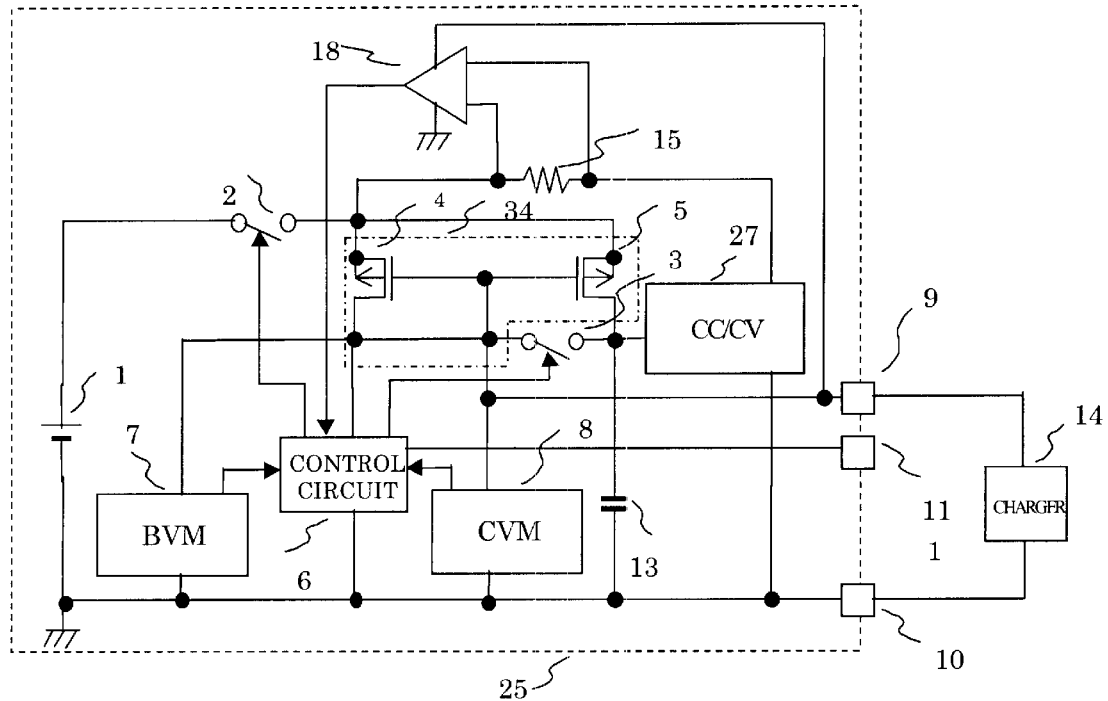
FIG. 9 illustrates a battery circuit capable of detecting a microcurrent in accordance with other aspects of the present invention.

FIG. 9 illustrates yet another embodiment of the present invention. In addition to the circuit illustrated in FIG. 8, the circuit contains a sense resistor 15 between the constant-current, constant-voltage generation circuit 27 and the secondary battery 1. A voltage drop over the sense resistor 15 is fed through a current detecting amplifier 18, which amplifies the voltage drop. The amplified voltage drop is then sent to the control circuit 6. This structure enables detecting of a charging current from the secondary battery 1.

The embodiment effectively achieves detecting a current of a very small amount. A high detection efficiency of a current of a larger amount can nonetheless be obtained by combining a conventional detection device and the embodiment, which compensate one another. In this case, capacitance of the regenerative capacitor 13 must be increased.

Figure 10:
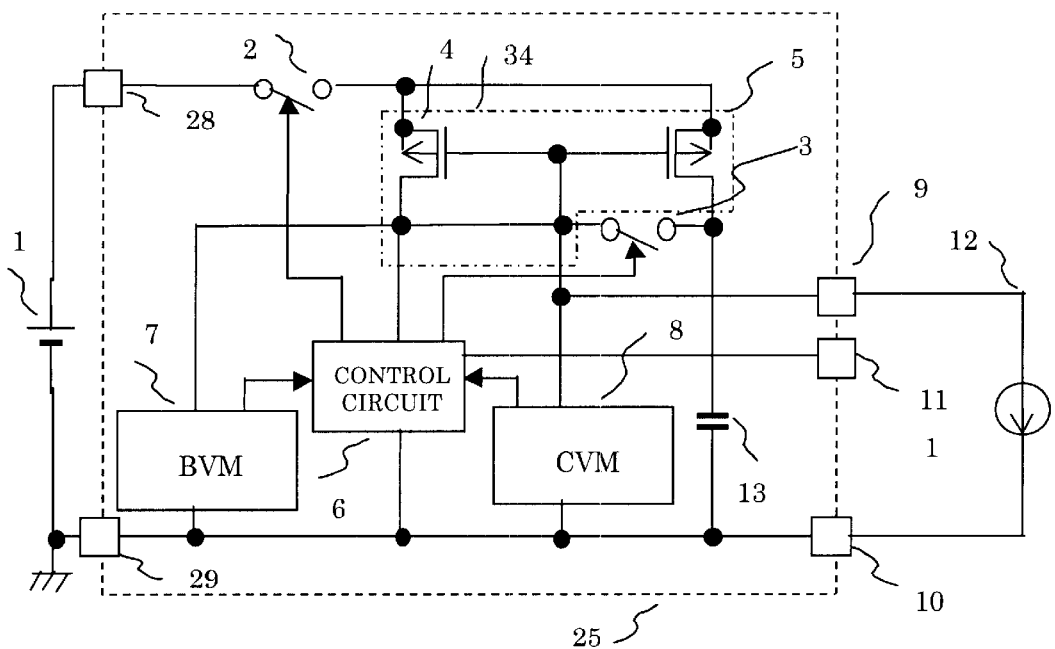
FIG. 10 illustrates a battery circuit capable of detecting a remaining microcurrent in accordance with other aspects of the present invention.

FIG. 10 illustrates yet another embodiment of the present invention. In this circuit, a battery is removed from the battery device. In other words, the secondary battery 1 is not part of the battery device 25. This circuit operates in the same way as the FIG. 2 circuit, but by removing the battery from the battery device it becomes possible to place on a single substrate the entire battery device 25. Thus, when the battery circuit 25 is placed in a notebook or other portable computer, the battery can be removed while the battery circuit 25 remains inside the portable computer. This allows the battery pack for notebook or other portable computers to be made smaller and cheaper.

Figure 11:
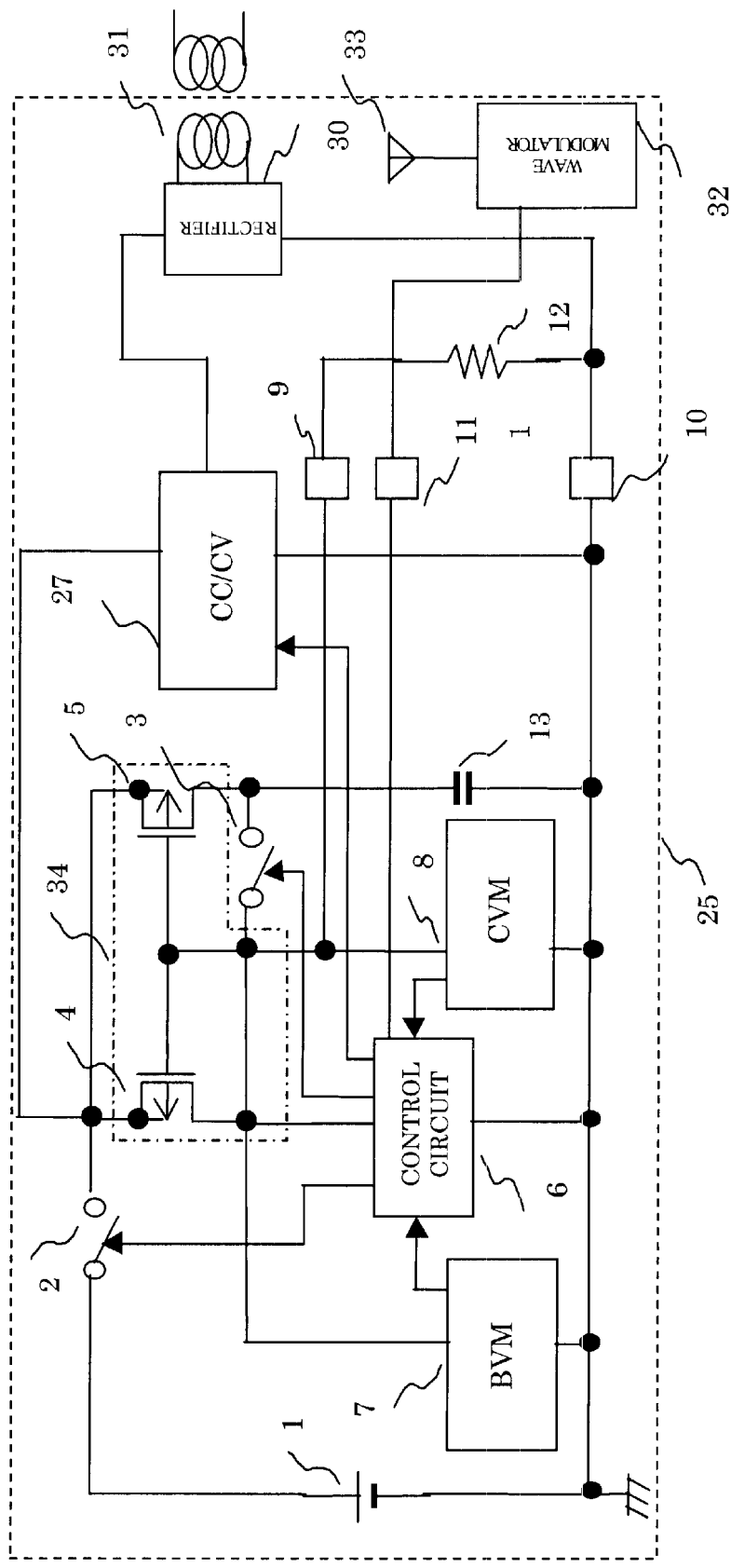
FIG. 11 illustrates a battery circuit capable of detecting a microcurrent in accordance with other aspects of the present invention.

FIG. 11 illustrates yet another embodiment of the present invention. This embodiment includes a circuit similar to the one shown in FIG. 8, and additionally includes a rectifier 30, transformer 31, wave modulator 32, and antenna 33 to facilitate remove monitoring and or remote charging of the illustrated battery system. By using the rectifier 30 and transformer 31, the secondary batteries can be charged wirelessly and remotely. The transformer eliminates a need to physically connect the battery circuit to the charging device. Moreover, the wave modulator 32 and antenna 33 allow battery data from the battery circuit to be transferred without a cable. Since the battery circuit shown in FIG. 11 is capable of performing charging, discharging, and data transfers without a cable, the battery circuit can be placed or implanted at a distant location. As a result, the battery circuit can be used in a variety of applications, such as medical implantable devices, temperature-measuring devices for water tanks, backup electrical sources and many others.

The present invention has been described in terms of various preferred embodiments. In most of these embodiments, a single secondary battery 1 is illustrated. However, those of ordinary skill in the art will appreciate that the teachings of the present invention are not limited to these described embodiments. Those of ordinary skill will appreciate that various modifications and extensions of the described embodiments might be made without varying from the basic teachings of the present invention. For example, if a number of secondary batteries are connected in series, an appropriate battery monitor circuit operates in the same manner as if a secondary battery voltage monitor circuit is connected to a single secondary battery. Similarly, if a number of secondary batteries are connected in parallel, an appropriate battery monitor circuit operates in the above-described manner. Consequently, the scope of the present invention is not to be limited to any of the described embodiments thereof but instead is to be determined from the claims, which follow.

What is claimed:

1. A battery circuit comprising:
   a capacitor selectively connectable to a secondary battery;
   a current amplifier amplifying battery current received from the secondary battery and supplying output current to the capacitor; and
   a monitor circuit coupled to the capacitor to detect a characteristic of the secondary battery indirectly by measuring a voltage of the capacitor or by measuring a capacitor discharge current from the capacitor.

2. The battery circuit of claim 1, further comprising terminals for receiving a replaceable secondary battery, the capacitor selectively connected to the terminals.

3. The battery circuit of claim 1, wherein the current amplifier has a gain greater than one.

4. The battery circuit of claim 1, wherein the current amplifier is a current mirror circuit.

5. The battery circuit of claim 4, wherein the current mirror circuit includes two transistors, at least a portion of current flowing from a secondary battery through a first transistor and the battery current flowing through a second transistor responsive to the current flowing through the first transistor.

6. The battery circuit of claim 5, further comprising at least two switches, the first switch selectively completing a current path from the secondary battery to the capacitor through the current amplifier, and the second switch selectively connecting the drain terminals of the first and second transistors.

7. The battery circuit of claim 1, further comprising a secondary battery voltage monitor circuit to detect voltage of the secondary battery.

8. The battery circuit of claim 1, further comprising a transformer and a rectifier adapted to receive charging power through a wireless coupling, the transformer and the rectifier providing a charging current supplied to the secondary battery.

9. The battery circuit of claim 1, further comprising a control circuit for outputting a battery remaining stored charge, battery voltage, and number of charging cycles to a wave modulator and an antenna to transfer the battery remaining capacitance, battery voltage and the number of charging cycles to an external device.

10. The battery circuit of claim 1, further comprising a transformer and a rectifier adapted to receive charging power through a wireless coupling, the transformer and the rectifier providing a charging current supplied to the secondary battery, and a control circuit for outputting a battery remaining stored charge, battery voltage, and number of charging cycles to a wave modulator and an antenna to transfer the battery remaining capacitance, battery voltage and the number of charging cycles to an external device.

11. A battery circuit comprising:
    a secondary battery;
    a current amplifier amplifying current from the secondary battery and supplying output current to a capacitor, a current path from the secondary battery to the capacitor selectively connected to charge the capacitor;
    a monitor circuit coupled to the capacitor to detect a characteristic of the secondary battery indirectly by measuring a voltage of the capacitor with the capacitor disconnected from the secondary battery.

12. The battery circuit of claim 11, wherein the current amplifier has a gain greater than one.

13. The battery circuit of claim 11, wherein the current amplifier is a current mirror circuit.

14. The battery circuit of claim 13, wherein the current mirror circuit includes two transistors, at least a portion of current flowing from a secondary battery through a first transistor and the battery current flowing through a second transistor responsive to the current flowing through the first transistor.

15. The battery circuit of claim 14, further comprising at least two switches, the first switch selectively completing a current path from the secondary battery to the capacitor through the current amplifier, and the second switch selectively connecting the drain terminals of the first and second transistors.

16. The battery circuit of claim 11, further comprising a secondary battery voltage monitor circuit to detect voltage of the secondary battery.

17. The battery circuit of claim 11, further comprising a transformer and a rectifier adapted to receive charging power through a wireless coupling, the transformer and the rectifier providing a charging current supplied to the secondary battery.

18. The battery circuit of claim 11, further comprising a control circuit for outputting a battery remaining stored charge, battery voltage, and number of charging cycles to a wave modulator and an antenna to transfer the battery remaining capacitance, battery voltage and the number of charging cycles to an external device.

19. The battery circuit of claim 11, further comprising a transformer and a rectifier adapted to receive charging power through a wireless coupling, the transformer and the rectifier providing a charging current supplied to the secondary battery, and a control circuit for outputting a battery remaining stored charge, battery voltage, and number of charging cycles to a wave modulator and an antenna to transfer the battery remaining capacitance, battery voltage and the number of charging cycles to an external device.

20. A method of measuring a microcurrent flowing from a secondary battery in a battery circuit, the method comprising:
    turning a first switch ON to connect the secondary battery to a capacitor in common with gate terminals of first and second transistors constituting a current amplifier and turning a second switch OFF to disconnect drain terminals of the first and second transistors,
    monitoring a terminal voltage of the capacitor with a capacitor voltage monitor to identify when the terminal voltage of the capacitor increases to a predetermined maximum voltage;
    turning the first switch OFF and the second switch ON to connect the capacitor and an external load when the terminal voltage of the capacitor reaches the predetermined maximum voltage;
    monitoring the terminal voltage of the capacitor with the capacitor voltage monitor to identify when the terminal voltage of the capacitor decreases to a predetermined minimum voltage; and
    turning the first switch ON and turning the second switch OFF to repeat the same cycle.

21. The method of claim 20, additionally comprising monitoring the voltage of the secondary battery.

22. The method of claim 20, additionally comprising charging the secondary battery via a transformer and a rectifier.

23. The method of claim 20, additionally comprising outputting a battery remaining stored charge, battery voltage, and the number of charging cycles to an external device to an external device.

24. The method of claim 23, further comprising charging the secondary battery via a transformer and a rectifier, and outputting a battery remaining stored charge, battery voltage, and the number of charging cycles to an external device to an external device.

* * * * *